United States Patent
Son et al.

(10) Patent No.: US 10,854,947 B2
(45) Date of Patent: Dec. 1, 2020

(54) HEAT DISSIPATION STRUCTURE FOR ELECTRONIC DEVICE INCLUDING ANTENNA MODULE

(71) Applicant: Samsung Electronics Co., Ltd., Gyeonggi-do (KR)

(72) Inventors: Kwonho Son, Gyeonggi-do (KR); Heecheul Moon, Gyeonggi-do (KR); Sangyoup Seok, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/577,767

(22) Filed: Sep. 20, 2019

(65) Prior Publication Data
US 2020/0168977 A1    May 28, 2020

(30) Foreign Application Priority Data
Nov. 22, 2018   (KR) .......................... 10-2018-0145694

(51) Int. Cl.
| | |
|---|---|
| *H01Q 1/22* | (2006.01) |
| *H04B 1/00* | (2006.01) |
| *H01L 23/34* | (2006.01) |
| *H01L 23/36* | (2006.01) |
| *H01Q 21/00* | (2006.01) |
| *H05K 7/20* | (2006.01) |

(Continued)

(52) U.S. Cl.
CPC ............ *H01Q 1/02* (2013.01); *H04M 1/0277* (2013.01); *H05K 5/0017* (2013.01); *H05K 5/04* (2013.01); *H05K 7/20436* (2013.01)

(58) Field of Classification Search
CPC ........ H04B 1/005; H04B 1/0064; H01Q 1/22; H01Q 9/04; H01Q 1/12; H01Q 21/00; H01L 23/24; H01L 23/36; H01L 23/373; H01L 23/34; H01L 23/367; H05K 7/20; H05K 7/20518
See application file for complete search history.

(56) References Cited

U.S. PATENT DOCUMENTS 9,285,843 B2 *   3/2016   Choi ................... H04M 1/0262
9,774,080 B2 *   9/2017   Baek ...................... H01Q 1/526
(Continued)

FOREIGN PATENT DOCUMENTS

JP       2013-214868       10/2013

OTHER PUBLICATIONS

European Search Report dated Mar. 30, 2020 issued in counterpart application No. 19197193.6-1205, 10 pages.

*Primary Examiner* — Blane J Jackson
(74) *Attorney, Agent, or Firm* — The Farrell Law Firm, P.C.

(57) ABSTRACT

An electronic device is provided. The electronic device includes a housing, a display exposed through at least a portion of the housing, a battery disposed in the housing, an antenna module disposed in the housing and spaced apart from the battery, a first electronic component positioned between the antenna module and the battery, a first heat dissipation member disposed to partially overlap the first electronic component and to extend toward the antenna module, a frame disposed to partially overlap the first heat dissipation member, surround at least a part of the first electronic component, and form a part of an outer appearance of the electronic device, and a heat insulation member interposed between the frame and the first heat dissipation member.

19 Claims, 19 Drawing Sheets

(51) Int. Cl.
*H01Q 1/02* (2006.01)
*H04M 1/02* (2006.01)
*H05K 5/00* (2006.01)
*H05K 5/04* (2006.01)

(56) References Cited

U.S. PATENT DOCUMENTS

| | | | |
|---|---|---|---|
| 2012/0256796 A1* | 10/2012 | Leiba | H01Q 1/2283 |
| | | | 343/702 |
| 2015/0185459 A1* | 7/2015 | Clark | G02B 21/086 |
| | | | 359/385 |
| 2015/0241935 A1 | 8/2015 | Jang et al. | |
| 2015/0288053 A1 | 10/2015 | Saxe et al. | |
| 2016/0028154 A1 | 1/2016 | Baek et al. | |
| 2016/0204640 A1* | 7/2016 | Kwak | H02J 7/0091 |
| | | | 455/573 |
| 2017/0062899 A1 | 3/2017 | Takahashi et al. | |
| 2018/0026326 A1* | 1/2018 | Noh | H01Q 1/50 |
| | | | 343/904 |
| 2018/0035528 A1* | 2/2018 | Kim | G06F 1/203 |
| 2018/0090816 A1 | 3/2018 | Mow et al. | |
| 2018/0205131 A1* | 7/2018 | Hwang | H05K 7/20472 |
| 2019/0104212 A1* | 4/2019 | Lee | H01Q 1/2283 |
| 2019/0394905 A1* | 12/2019 | Jin | H05K 7/20509 |
| 2020/0106167 A1* | 4/2020 | Moon | H04M 1/026 |

\* cited by examiner

US 10,854,947 B2

HEAT DISSIPATION STRUCTURE FOR ELECTRONIC DEVICE INCLUDING ANTENNA MODULE

CROSS-REFERENCE TO RELATED APPLICATION(S)

This application is based on and claims priority under 35 U.S.C. § 119 to Korean Patent Application No. 10-2018-0145694, filed on Nov. 22, 2018, in the Korean Intellectual Property Office, the disclosure of which is incorporated herein by reference in its entirety.

BACKGROUND

1. Field

The present disclosure relates generally to an electronic device including an antenna module and, more particularly, to a structure and method for heat dissipation of an antenna module of a wireless communication system implemented in a super-high frequency band.

2. Description of Related Art

A variety of electronic devices may transmit/receive various data through a wireless communication system. Currently, in order to satisfy an increasing demand of radio data traffic or to achieve a high data transfer rate, a wireless communication system is being studied for implementation in a super-high frequency band. Further, effective heat dissipation of an antenna module is also being studied for smooth operation of a wireless communication system in a super-high frequency band.

A wireless communication system using a wavelength of a low frequency bandwidth may be able to utilize a metallic radiator disposed inside or outside of an electronic device. In contrast, a wireless communication system implemented in a super-high frequency band requires an antenna radiation module including a dipole antenna and a patch antenna and being mounted inside an electronic device. The antenna radiation module may produce a significant amount of heat, but it may be difficult to arrange a metallic material for heat dissipation in close proximity due to characteristics of the wireless communication system of the super-high frequency band in which an antenna radiation module is mounted.

SUMMARY

An aspect of the present disclosure provides a structure and method for heat dissipation of an antenna module of a wireless communication system implemented in a super-high frequency band.

According to an aspect of the present disclosure, an electronic device is provided. The electronic device includes a housing, a display exposed through at least a portion of the housing, a battery disposed in the housing, an antenna module disposed in the housing and spaced apart from the battery, a first electronic component positioned between the antenna module and the battery, a first heat dissipation member disposed to partially overlap the first electronic component and to extend toward the antenna module, a frame disposed to partially overlap the first heat dissipation member, surround at least a part of the first electronic component, and form a part of an outer appearance of the electronic device, and a heat insulation member interposed between the frame and the first heat dissipation member.

According to another aspect of the present disclosure, a heat dissipation structure is provided. The heat dissipation structure includes a frame surrounding at least a portion of a component exposed to an outer surface of an electronic device and forming a part of the outer surface of the electronic device, a heat dissipation sheet thermally connected to a battery of the electronic device, a first heat dissipation member disposed to partially overlap the frame, extended toward an antenna module of the electronic device, and thermally connected to the heat dissipation sheet, and a heat insulation member interposed between the frame and the first heat dissipation member.

According to another aspect of the present disclosure, a heat dissipation structure is provided. The heat dissipation structure includes a frame surrounding at least a portion of a component exposed to an outer surface of an electronic device and forming a part of the outer surface of the electronic device, a first heat dissipation member disposed to partially overlap the frame, and extended, at one end thereof, toward an antenna module of the electronic device, a second heat dissipation member thermally connecting the antenna module and the first heat dissipation member, and a heat insulation member interposed between the frame and the first heat dissipation member.

BRIEF DESCRIPTION OF THE DRAWINGS

The above and other aspects, features, and advantages of certain embodiments of the present disclosure will be more apparent from the following description taken in conjunction with the accompanying drawing, in which.

DETAILED DESCRIPTION

Hereinafter, embodiments of the present disclosure are described in detail with reference to accompanying drawings.

Figure 1:
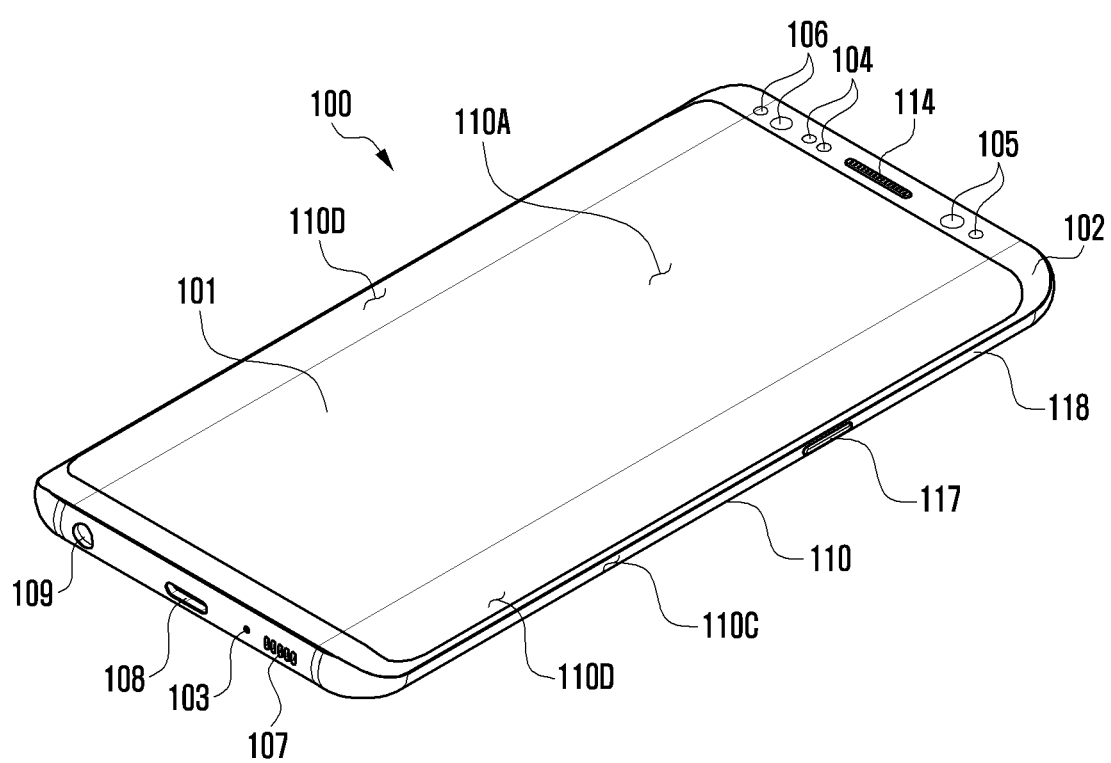
FIG. 1 is a perspective view showing a front surface of a mobile electronic device according to an embodiment.
Figure 2:
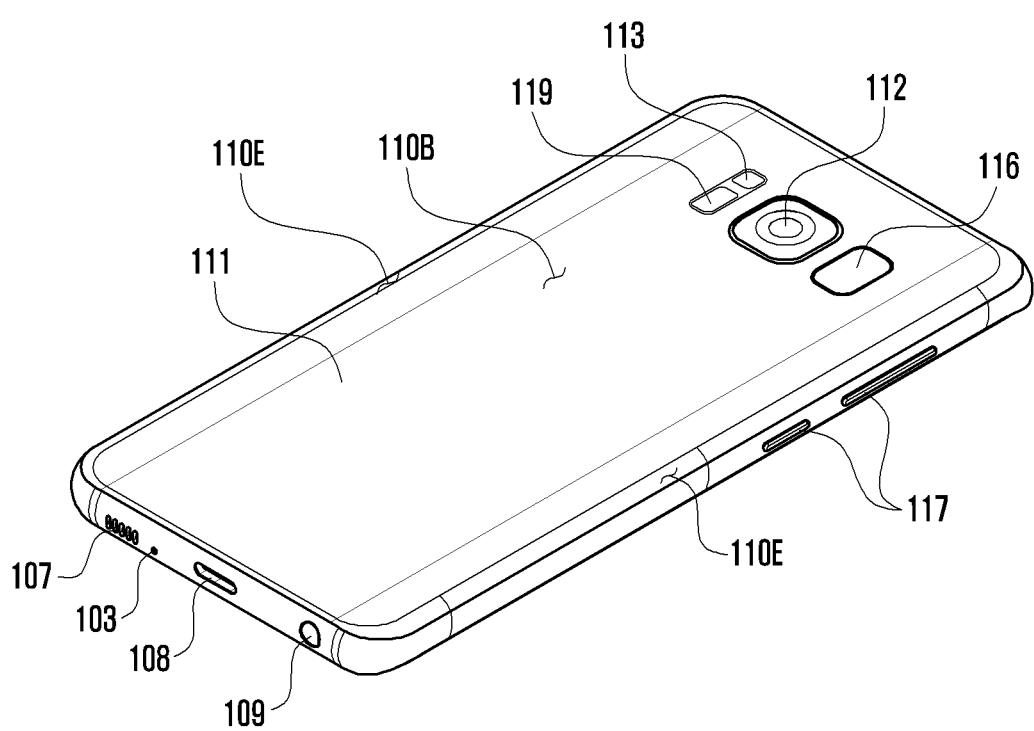
FIG. 2 is a perspective view showing a rear surface of the mobile electronic device shown in FIG. 1.

FIG. 1 is a perspective view showing a front surface of a mobile electronic device 100 according to an embodiment, and FIG. 2 is a perspective view showing a rear surface of the mobile electronic device 100 shown in FIG. 1.

Referring to FIGS. 1 and 2, the mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104, 116 and 119, camera modules 105, 112 and 113, a key input device 117, a light emitting device 106, and connector holes 108 and 109. The mobile electronic device 100 may omit at least one (e.g., the key input device 117 or the light emitting device 106) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. Outlines (i.e., edges and corners) of the display 101 may have substantially the same form as those of the front plate 102. The spacing between the outline of the display 101 and the outline of the front plate 102 may be substantially unchanged in order to enlarge the exposed area of the display 101.

A recess or opening may be formed in a portion of a display area of the display 101 to accommodate at least one of the audio module 114, the sensor module 104, the camera module 105, and the light emitting device 106. At least one of the audio module 114, the sensor module 104, the camera module 105, the fingerprint sensor 116, and the light emitting element 106 may be disposed on the back of the display area of the display 101. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104, 116 and 119 may generate electrical signals or data corresponding to an internal operating state of the mobile electronic device 100 or to an external environmental condition. The sensor modules 104, 116 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module 116 (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module 116 disposed on the second surface 110B of the housing 110.

The light emitting device 106 may be disposed on the first surface 110A of the housing 110. For example, the light emitting device 106 may provide status information of the electronic device 100 in an optical form. The light emitting device 106 may provide a light source associated with the operation of the camera module 105. The light emitting device 106 may include, for example, a light emitting diode (LED), an IR LED, or a xenon lamp.

The connector holes 108 and 109 may include a first connector hole 108 adapted for a connector (e.g., a universal serial bus (USB) connector) for transmitting and receiving power and/or data to and from an external electronic device, and/or a second connector hole 109 adapted for a connector (e.g., an earphone jack) for transmitting and receiving an audio signal to and from an external electronic device.

Figure 3:
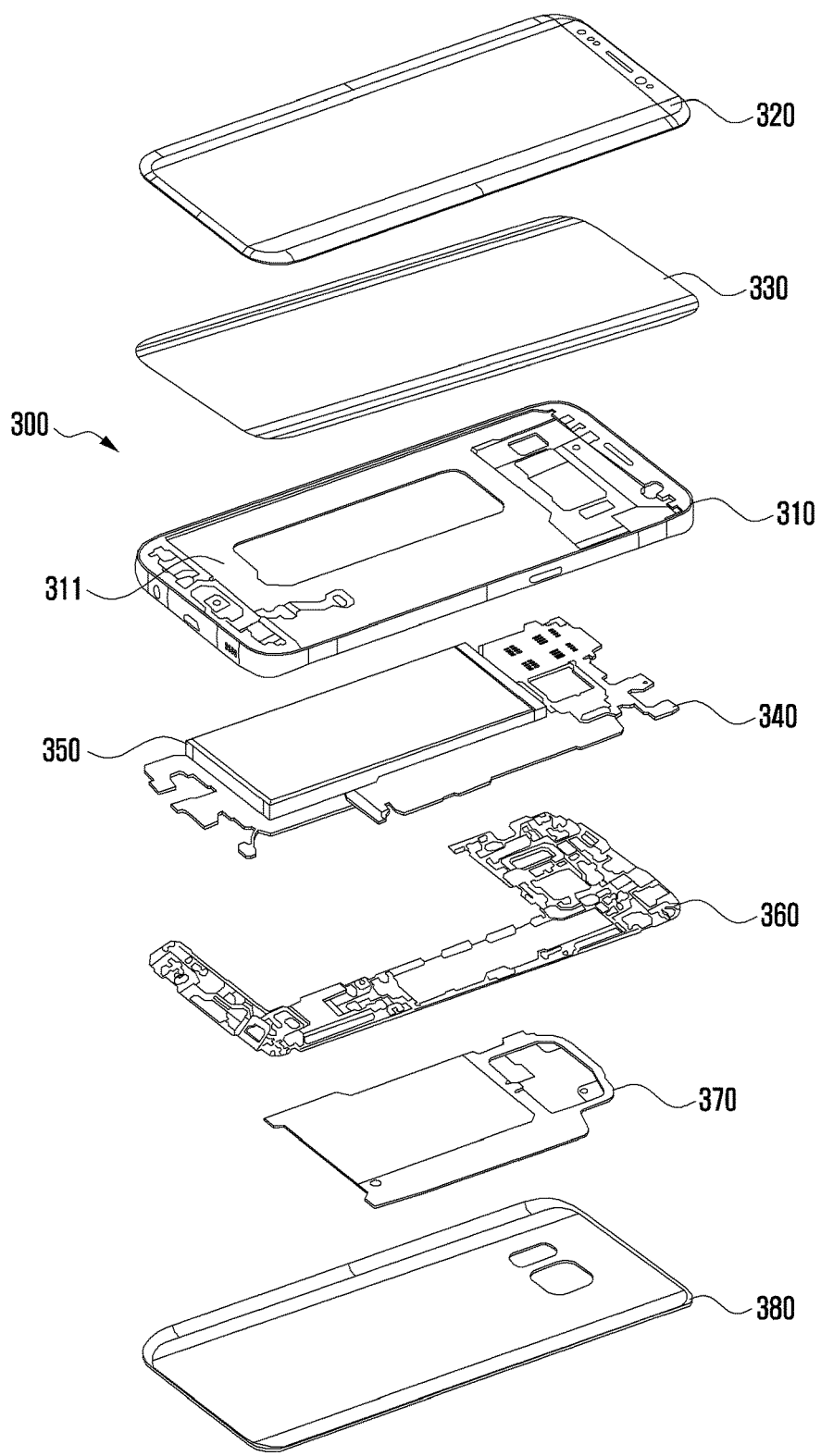
FIG. 3 is an exploded perspective view showing the mobile electronic device shown in FIG. 1.

FIG. 3 is an exploded perspective view showing a mobile electronic device 300 shown in FIG. 1.

Referring to FIG. 3, the mobile electronic device 300 may include a lateral bezel structure 310, a first support member 311 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 100 shown in FIG. 1 or FIG. 2, thus, descriptions thereof are omitted below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with the PCB 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, volatile memory or non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

Figure 4A:
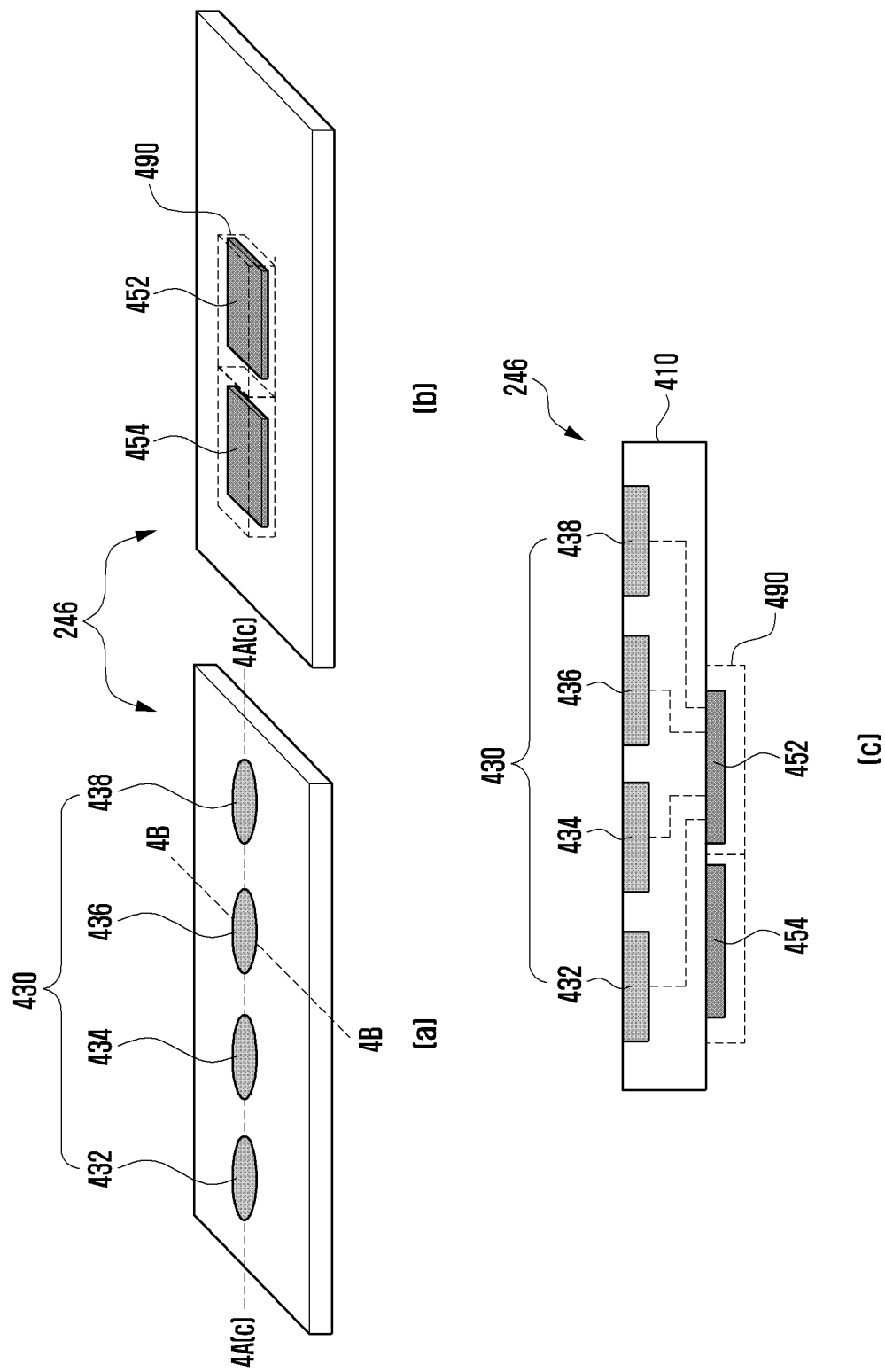
FIG. 4A is an illustration of a structure of an antenna module according to an embodiment.

FIG. 4A is an illustration of a structure of an antenna module 246. Specifically, in FIG. 4A, panel (a) is a perspective view showing an upper surface of the antenna module 246, and panel (b) is a perspective view showing a lower surface of the antenna module 246. In addition, panel (c) is a cross-sectional view taken along the line 4A(c)-4A(c).

Referring to FIG. 4A, the antenna module 246 may include a PCB 410, an antenna array 430, an RFIC 452, and a PMIC 454. Optionally, the antenna module 246 may further include a shielding member 490. At least one of the above-mentioned components may be omitted, or at least two of the above components may be integrally formed.

The PCB 410 may include a plurality of conductive layers and a plurality of non-conductive layers stacked alternately with the conductive layers. Using wirings formed in the conductive layers and conductive vias formed in the non-conductive layers, the PCB 410 may provide electrical connections among various electronic components disposed therein/thereon.

The antenna array 430 may include a plurality of antenna elements 432, 434, 436, and 438 arranged to form a directional beam. The antenna elements 432, 434, 436, and 438 may be formed on a first surface of the PCB 410 as shown. The antenna array 430 may be formed inside the PCB 410. The antenna array 430 may include a plurality of antenna arrays having the same shape/type or different shapes/types (e.g., a dipole antenna array and/or a patch antenna array).

The RFIC 452 may be disposed on a second surface, opposite to the first surface, of the PCB 410 to be spaced apart from the antenna array 430. The RFIC 452 is configured to process a signal of a selected frequency band transmitted/received through the antenna array 430. In case of transmission, the RFIC 452 may convert a baseband signal obtained from a communication processor into an RF signal of a specified band. In addition, in case of reception, the RFIC 452 may convert an RF signal received through the antenna array 430 into a baseband signal and then deliver the baseband signal to the communication processor.

In case of transmission, the RFIC 452 may up-convert an IF signal (e.g., about 9 GHz to about 11 GHz), obtained from an IF integrated circuit (IFIC), to an RF signal of a selected band. In addition, in case of reception, the RFIC 452 may down-convert an RF signal obtained through the antenna array 430, convert the down-converted signal into an IF signal, and then deliver the IF signal to the IFIC.

The PMIC 454 may be disposed on the second surface of the PCB 410 to be spaced apart from the antenna array 430. The PMIC 454 may receive an electric current from a main PCB and provide the necessary power to various components (e.g., the RFIC 452) on the antenna module.

The shielding member 490 may be disposed on the second surface of the PCB 410 to electromagnetically shield at least one of the RFIC 452 and the PMIC 454. The shielding member 490 may be formed of a shield can.

The antenna module 246 may be electrically coupled to another PCB (e.g., a main PCB) via a module interface. The module interface may include a connecting member such as a coaxial cable connector, a board-to-board connector, an interposer, or a flexible PCB (FPCB). The RFIC 452 and/or the PMIC 454 of the antenna module may be electrically connected to the PCB through the connecting member.

Figure 4B:
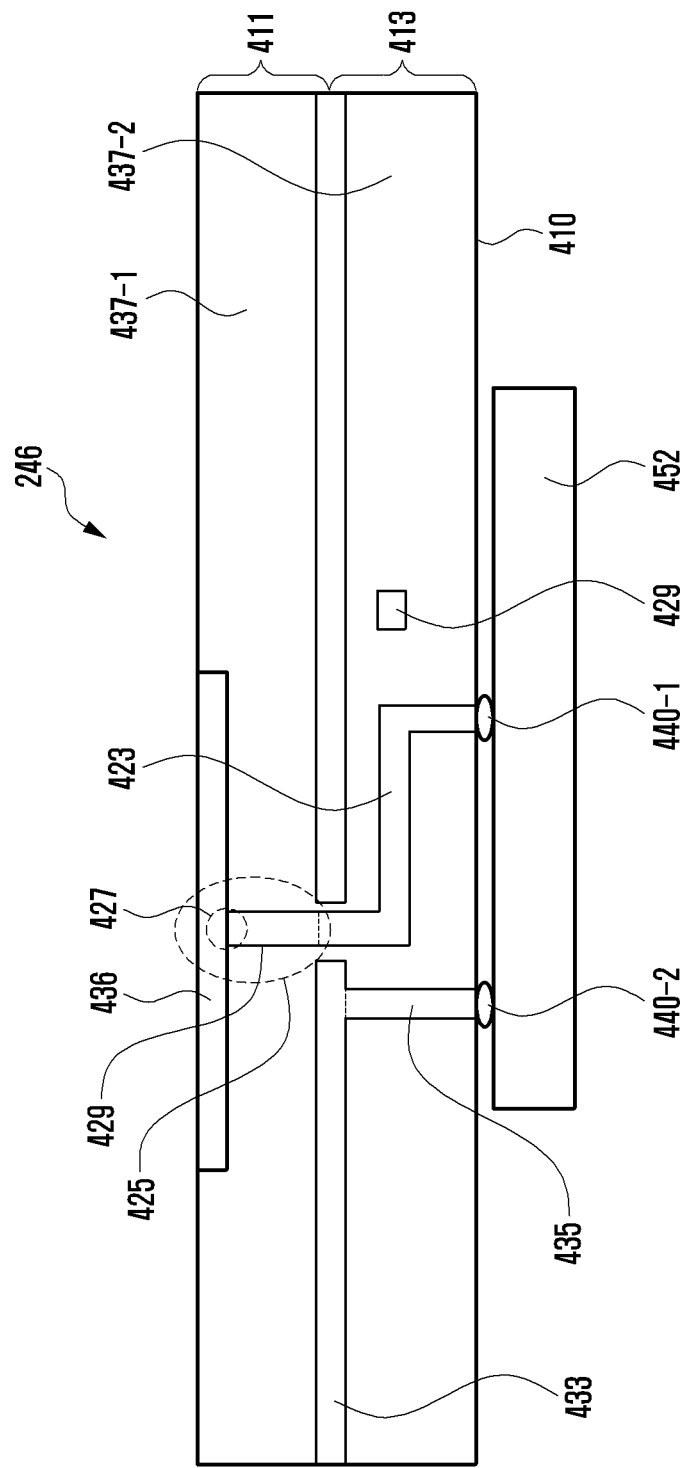
FIG. 4B is a cross-sectional view taken along the line 4B-4B in FIG. 4A according to an embodiment.

FIG. 4B is a cross-sectional view of the antenna module 246 taken along the line 4A-4A in FIG. 4A. As shown, the PCB 410 may include an antenna layer 411 and a network layer 413.

Referring to FIG. 4B, the antenna layer 411 may include at least one dielectric layer 437-1. In addition, the antenna layer 411 may include an antenna element 436 and/or a power feeder 425, which are formed on or in the dielectric layer 437-1. The power feeder 425 may include a feed point 427 and/or a feed line 429.

The network layer 413 may include at least one dielectric layer 437-2. In addition, the network layer 413 may include at least one ground layer 433, at least one conductive via 435, a transmission line 423, and/or a signal line 429, which are formed on or in the dielectric layer 437-2.

In addition, the RFIC 452 may be electrically connected to the network layer 413 through, for example, first and second connection members (e.g., solder bumps) 440-1 and 440-2. Various connection members or structures such as soldering or ball grid array (BGA) may be used instead of the above connection members. The RFIC 452 may be electrically connected to the antenna element 436 through the first connection member 440-1, the transmission line 423, and the power feeder 425. In addition, the RFIC 452 may be electrically connected to the ground layer 433 via the second connection member 440-2 and the conductive via 435. The RFIC 452 may also be electrically coupled to the above-mentioned module interface through the signal line 429.

Figure 5:
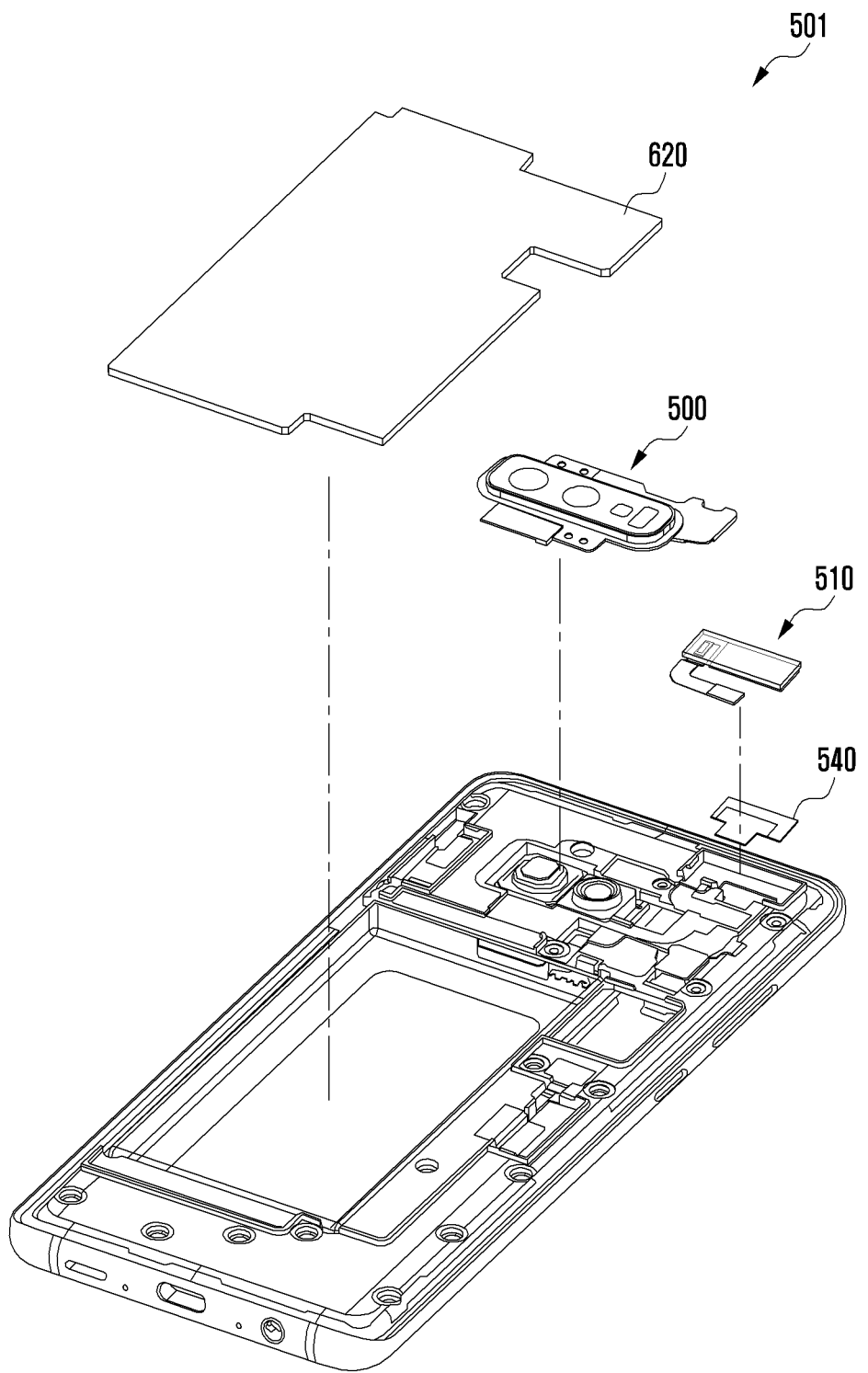
FIG. 5 is an exploded perspective view showing an electronic device according to an embodiment.

FIG. 5 is an exploded perspective view showing an electronic device according to an embodiment of the disclosure. Referring to FIG. 5, the mobile electronic device 501 may include an antenna module 510, a heat dissipation structure 500, a heat dissipation sheet 620, and a second heat dissipation member 540.

Figure 7A:
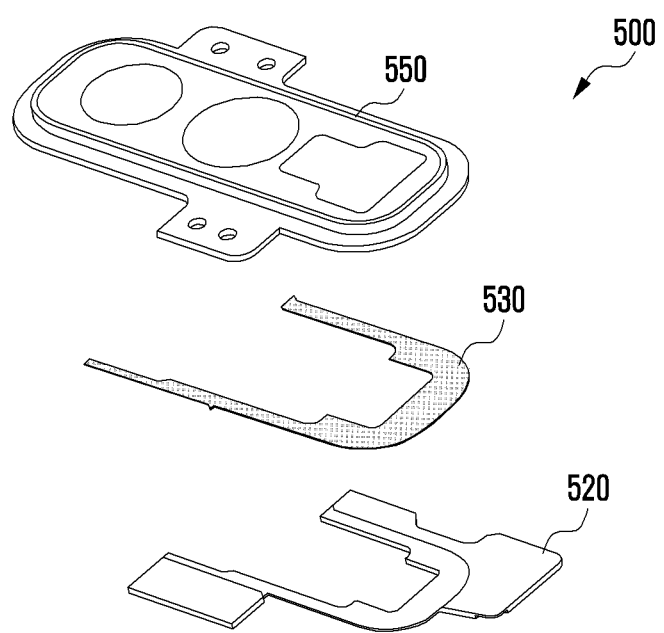
FIGS. 7A, 7B, 7C, 7D. 7E, and 7F are views showing a heat dissipation structure according to an embodiment.

The heat dissipation structure 500 performs a function of transmitting heat generated from the antenna module 510 to the heat dissipation sheet 620. As the mobile electronic device 501 becomes slimmer, an inner space of the mobile electronic device 501 becomes insufficient. In this situation, unintended interactions among components inside the mobile electronic device 501 may occur, causing unintended side effects. For example, the heat dissipation structure 500 described below in greater detail may include a frame 550, shown in FIG. 7A, a first heat dissipation member 520, shown in FIG. 7A, and a heat insulation member 530, where the heat generated in the antenna module 510 may be transmitted to the frame 550 which is in contact with the first heat dissipation member 520. The second heat dissipation member 540 may thermally connect the antenna module 510 and the heat dissipation structure 500. In the heat dissipation structure 500, the heat insulation member 530 may thermally isolate the frame 550 from the first heat dissipation member 520 so as to prevent the heat from being transmitted to the frame 550.

Figure 6:
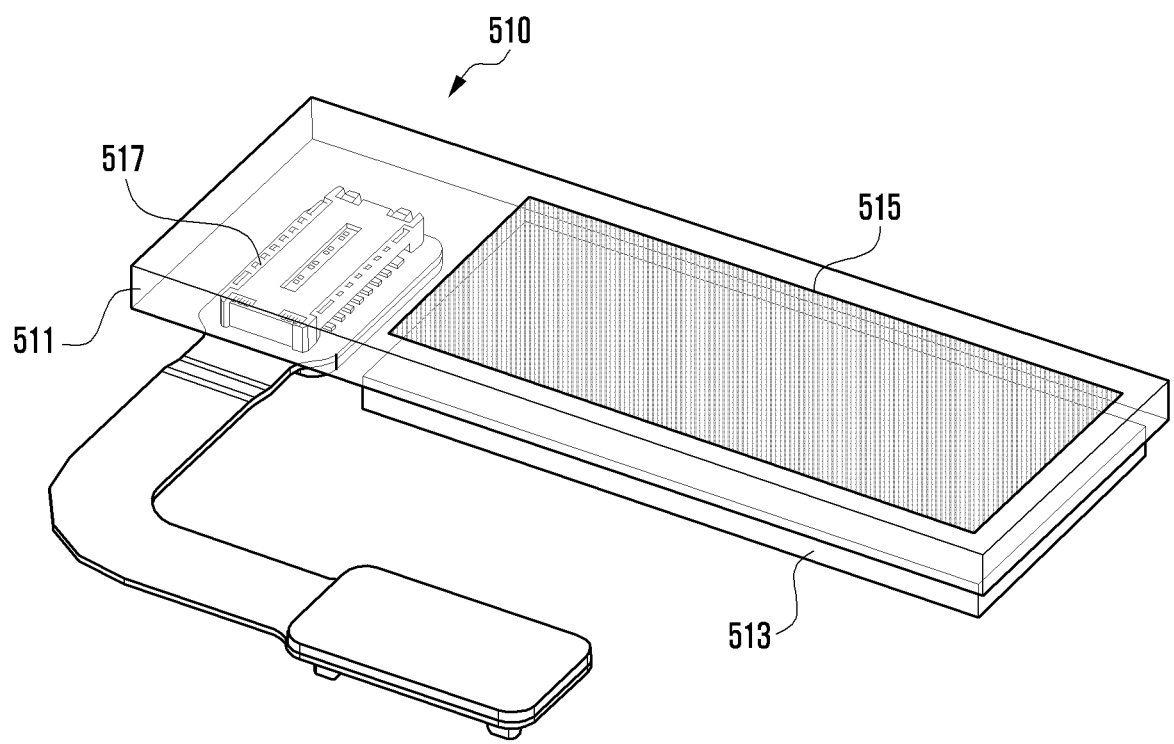
FIG. 6 is a perspective view showing an antenna module according to an embodiment.

FIG. 6 is a perspective view showing an antenna module 510 according to an embodiment.

Referring to FIG. 6, the antenna module 510 may include a circuit board 511. On one surface of the circuit board 511, various components 513 for communication are integrated. In addition, a connector terminal 517 may be disposed for connecting a connector that enables the communication components 513 to exchange signals with the mobile electronic device 501. On the other surface of the antenna module 510, an antenna pattern 515 for signal radiation may be formed.

A plurality of antenna modules 510 may be disposed in the mobile electronic device 501. Depending on disposed positions, various types of connectors may be connected to the connector terminals 517 to exchange signals with the mobile electronic device 501. For example, as shown in FIG. 9C described below in greater detail, one antenna module 510 may be disposed at an upper portion of the mobile electronic device 501, another antenna module 510' may be disposed at a left portion, and the other antenna module 510" may be disposed at a right portion. More than three antenna modules 510, 510', and 510" or less than three antenna modules 510, 510', and 510" may be disposed in the mobile electronic device 501. The connector may have various shapes corresponding to the disposed positions of the antenna modules 510, 510', and 510".

FIGS. 7A, 7B, 7C, 7D, 7E, and 7F are views showing a heat dissipation structure 500 according to an embodiment.

Figure 7B:
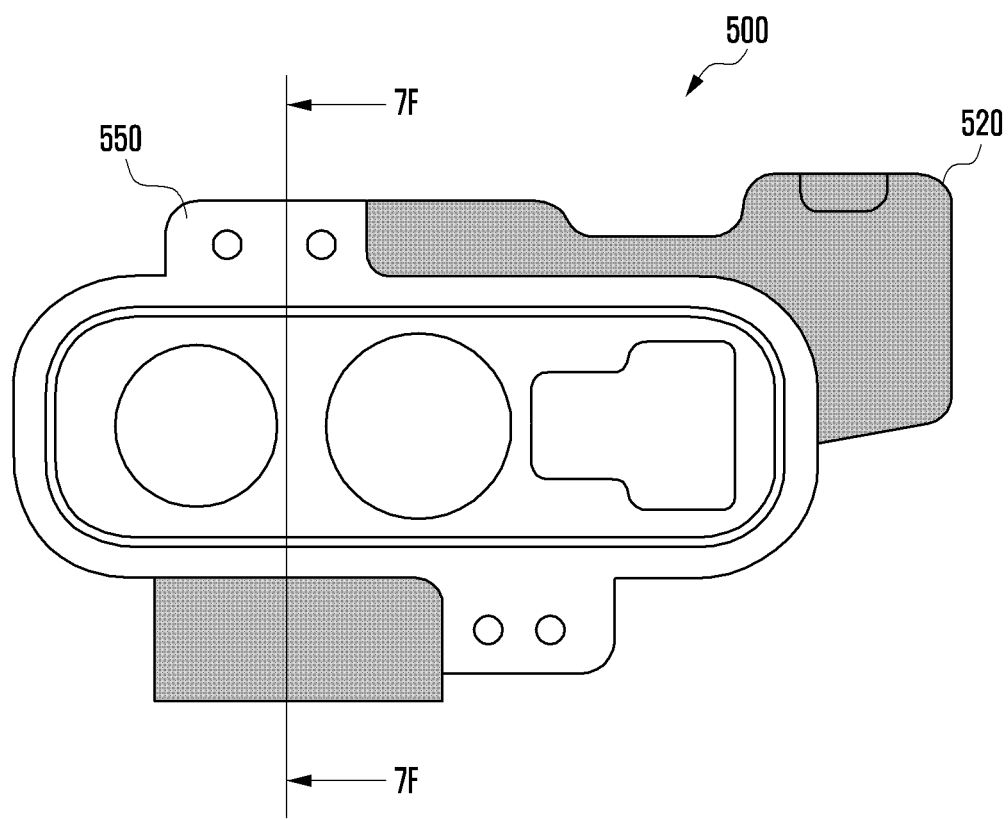
Figure 7C:
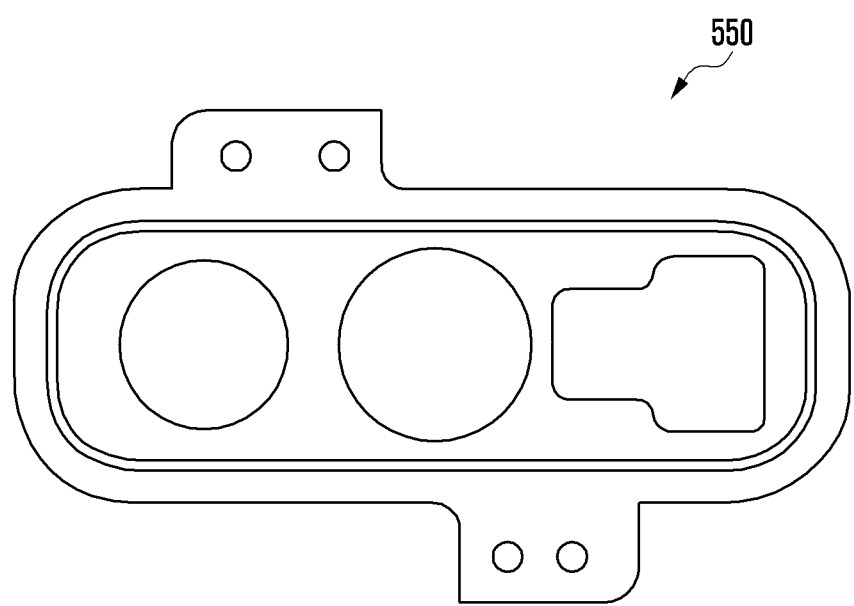
Figure 7D:
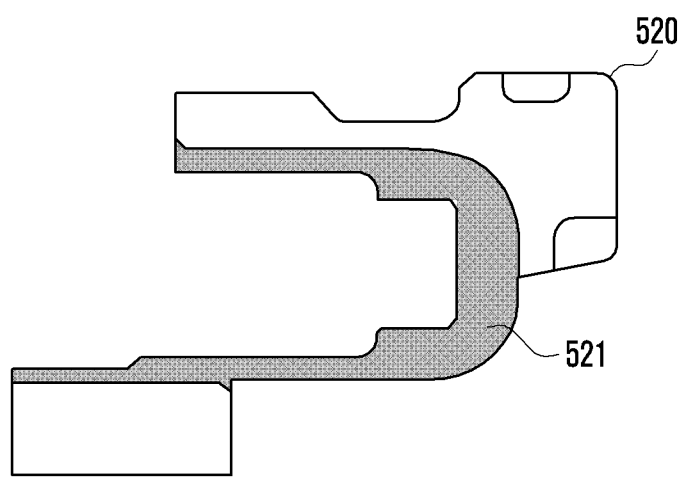
Figure 7E:
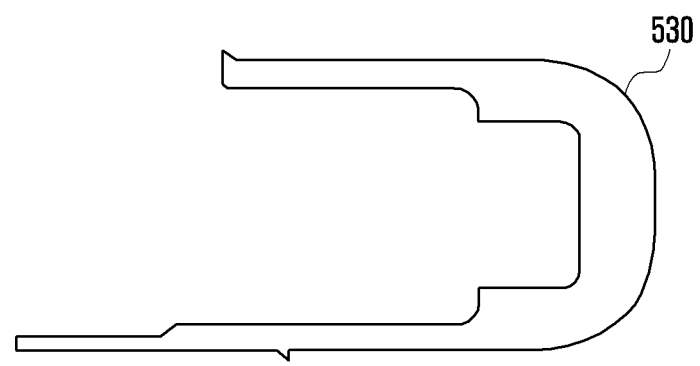
Figure 7F:
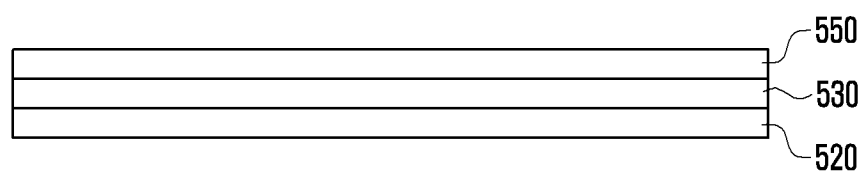

Referring to FIGS. 7A, 7B, 7C, 7D, 7E, and 7F, FIG. 7A is an exploded perspective view showing the heat dissipation structure 500, and FIG. 7B is a plan view showing the heat dissipation structure 500 after assembly. In addition, FIG. 7C is a plan view showing the frame 550, FIG. 7D is a plan view showing the first heat dissipation member 520, and FIG. 7E is a plan view showing the heat insulation member 530. In addition, FIG. 7F is a cross-sectional view taken along the line 7F-7F in FIG. 7B.

The heat dissipation structure 500 may include the frame 550, the first heat dissipation member 520, and the heat insulation member 530.

Referring to FIG. 7C, the frame 550 may be exposed to the outer surface of the mobile electronic device 501 to form a part of the outer appearance of the mobile electronic device 501. The frame 550 may be, for example, a decorative member such as a Cam deco. The frame 550 may be formed of a metallic material.

As the mobile electronic device 501 becomes increasingly slimmer, the spacing between internal components stacked in the direction of thickness of the mobile electronic device 501 becomes narrower. Therefore, in some cases, unintended interactions between such components may occur, resulting in unintended side effects.

For example, when the frame 550, which is formed of a metallic material, defines the position of an electronic component (e.g., a rear camera module 610 in FIG. 9B) exposed to the outer surface of the mobile electronic device 501, and protects the component, is in contact with a heat transfer medium for heat dissipation, such as the first heat dissipation member 520, an unintended side effect that heat is transferred to the frame 550 may occur. The heat dissipation structure 500 may block or alleviate such occurrence.

Referring to FIG. 7D, the first heat dissipation member 520 may perform a function of receiving heat generated from the antenna module 510 and delivering the received hear to another place. The first heat dissipation member 520 is formed to overlap and combine with the frame 550 at a portion 521 thereof. One end of the first heat dissipation member 520 may be extended toward the antenna module 510, and the other end may be thermally connected to a heat dissipation sheet 620. The first heat dissipation member 520 may be formed of a metallic material or another material that is effective for heat transfer. For example, a material such as copper, aluminum, stainless steel, graphite, or thermal-conductive plastic may be used for the first heat dissipation member 520.

Referring to FIGS. 7E and 7F, the heat insulation member 530 may be formed to match the shape of the portion 521 where the first heat dissipation member 520 and the frame 550 overlap with each other. The heat insulation member 530 may be interposed between the first heat dissipation member 520 and the frame 550 to prevent direct contact between the first heat dissipation member 520 and the frame 550. When the first heat dissipation member 520 transfers heat generated from the antenna module 510 to the heat dissipation sheet 620, the heat insulation member 530 interposed between the first heat dissipation member 520 and the frame 550 is capable of preventing the heat from being delivered to the frame 550.

Figure 8:
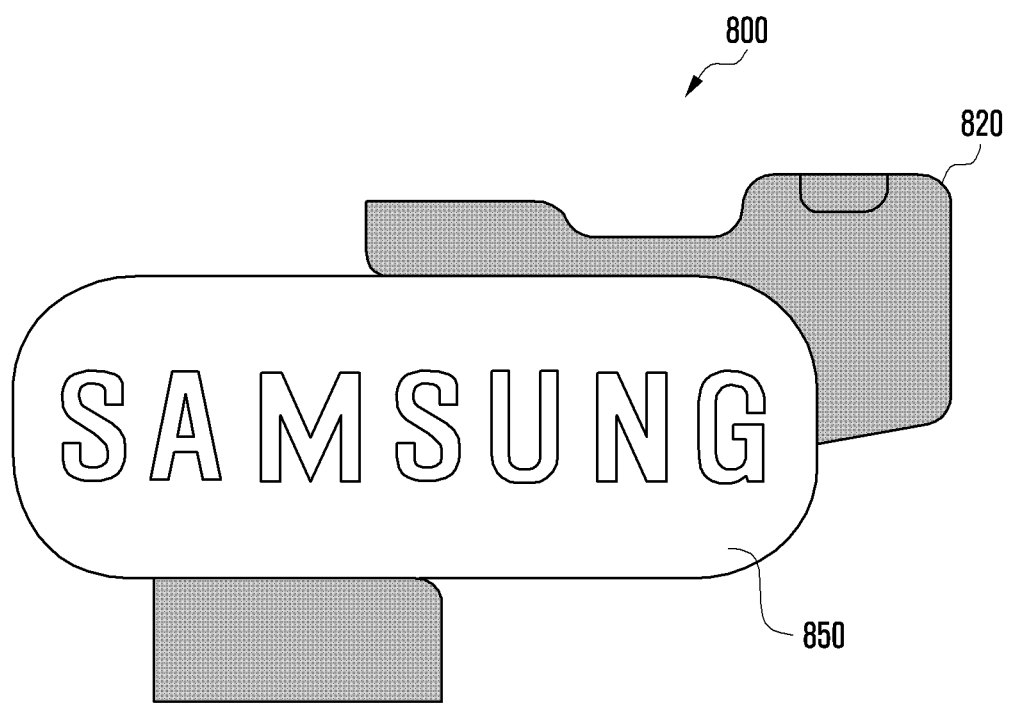
FIG. 8 is a view showing a heat dissipation structure according to an embodiment.

FIG. 8 is a view showing a heat dissipation structure 800 according to an embodiment.

Referring to FIG. 8, the heat dissipation structure 800 may be exposed to the outer surface of the mobile electronic device 501 while forming a part of the outer appearance of the mobile electronic device 501. In the heat dissipation structure 800, a frame 850 is similar to the above-described frame 550 in FIGS. 7A, 7B, 7C, 7D, 7E, and 7F. However, contrary to the above-described frame 550 formed as a decorative member such as a Cam deco, the frame 800 in FIG. 8 may be formed as a plate printed or engraved with a brand label and/or flange (820) coupled the plate.

As described above, the spacing between internal components of the slim mobile electronic device 501 becomes narrower, so that unintended heat transfer may be caused. In order to block or alleviate this occurrence, heat dissipation structure 800 may have a similar structure and function to the above-described heat dissipation structure 500. In particular, the frame 850 performs a role of exposing the brand label.

Figure 9A:
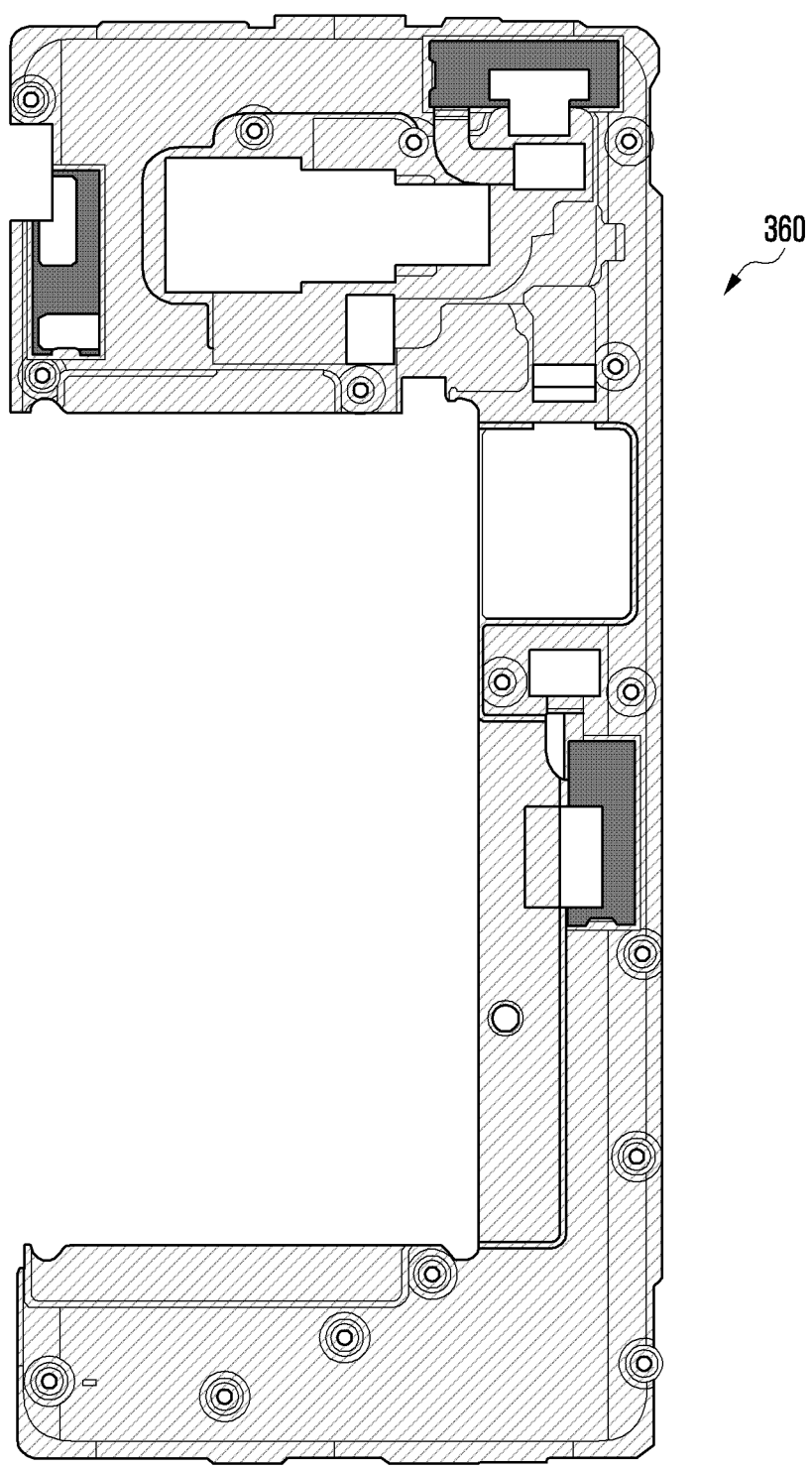
FIGS. 9A, 9B, and 9C are views showing an electronic device including a heat dissipation structure according to an embodiment.
Figure 9B:
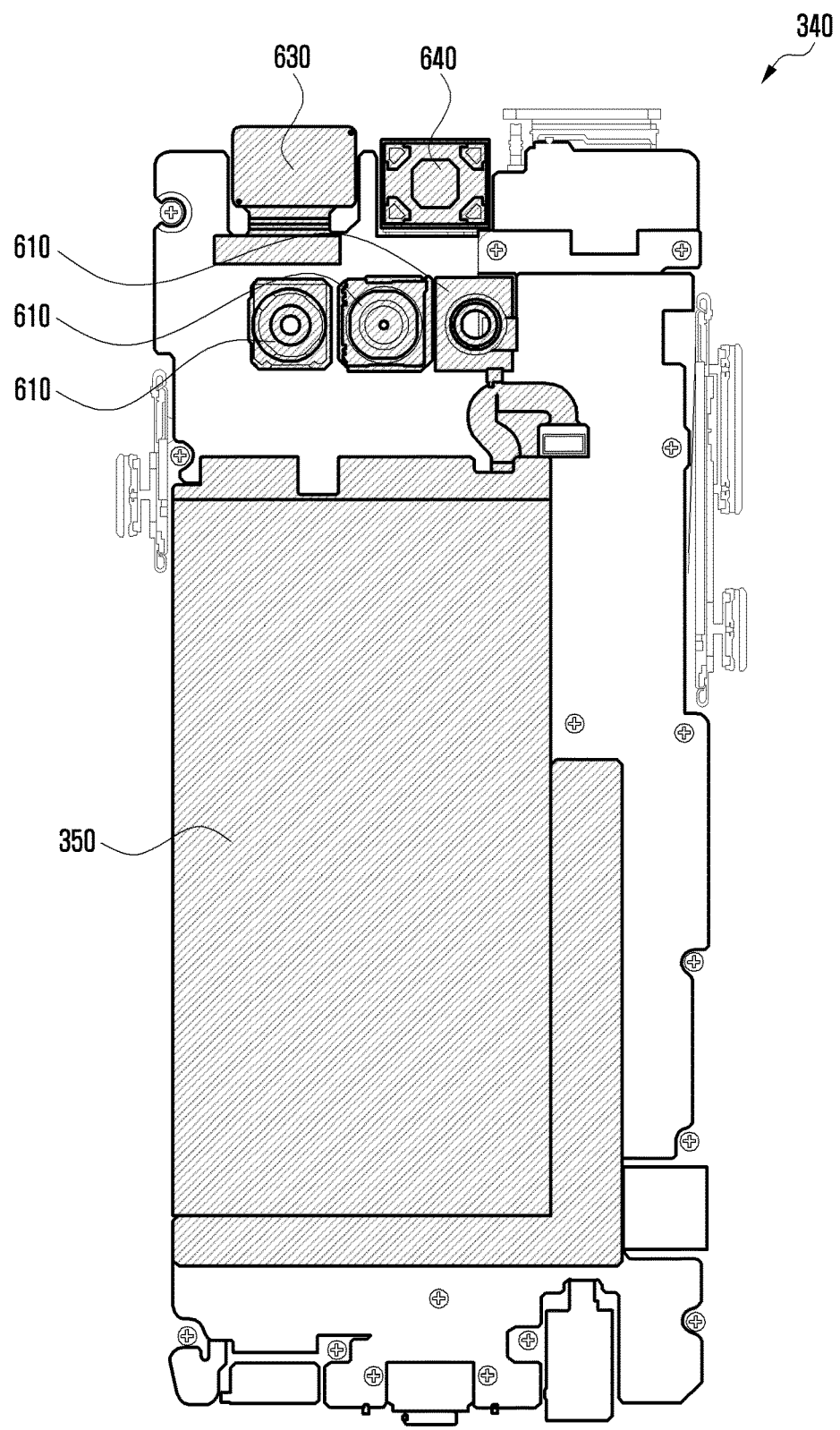
Figure 9C:
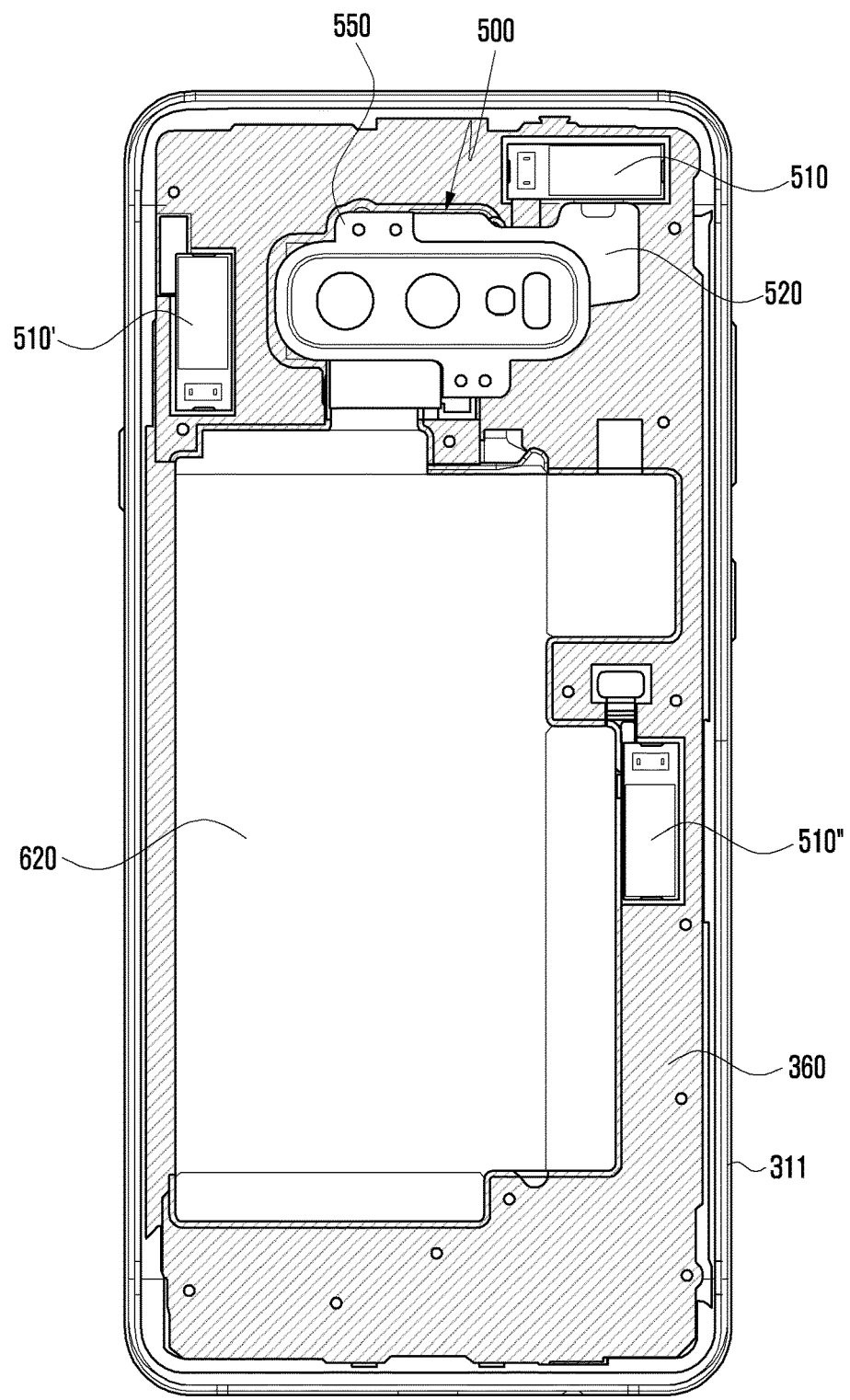

FIGS. 9A, 9B, and 9C are views showing an electronic device including a heat dissipation structure according to an embodiment.

Referring to FIGS. 9A, 9B, and 9C, a rear case 360 of the electronic device is shown, which is the same component as the second support member 360 shown and described above with reference to FIG. 3. FIG. 9B shows the PCB 340 and the battery 350, which are also shown and described above with reference to FIG. 3. FIG. 9C shows a state where the PCB 340, the antenna module 510, the heat dissipation structure 500, and the rear case 360 are mounted on a bracket 311 of the electronic device. The bracket 311 is the same component as the first support member 311 described above with reference to FIG. 3.

As shown in FIG. 9C, the electronic device may include a plurality of antenna modules 510, 510', and 510" disposed therein. These antenna modules 510, 510', and 510" may be disposed near the lateral side of the electronic device for effective radiation of radio waves.

As shown in FIG. 9B, the battery 350 may occupy a considerable space in the electronic device because the power capacity of the battery is proportional to the size of the battery. When the battery 350 supplies power to components of the electronic device, heat may be generated. Therefore, as shown in FIG. 9C, the heat dissipation sheet 620 may be disposed on the battery 350 to diffuse the heat generated from the battery 350 as broad as possible within a limited space of the electronic device.

The heat dissipation sheet 620 according to an embodiment is formed of a plate that has a vacuum internal space and may contain a minute amount of moisture therein. The heat generated from the battery 350 is diffused through conduction. In addition, the heat may be rapidly diffused because of the moisture being easily evaporated and spread inside the vacuum internal space.

In addition, the antenna modules 510, 510', and 510" generate heat during operation and, thus, require heat dissipation. However, due to constraints of space and radiation performance of the antenna module 510, 510', and 510", it may be difficult to dispose the heat dissipation sheet 620 for and toward the antenna modules 510, 510', and 510". Therefore, the heat dissipation structure 500 is separately used to remove heat generated from the antenna module 510 by transferring the heat of the antenna module 510 to the heat dissipation sheet 620.

The antenna module 510 disposed at an upper portion of the mobile electronic device 501 as shown in FIG. 9C may have difficulty in being directly connected to the heat dissipation sheet 620 on the PCB 340 due to the rear camera modules 610 disposed between the antenna module 510 and the heat dissipation sheet 620 as shown in FIG. 9B.

Therefore, the heat dissipation structure 500 may have a partially overlapped structure between the first heat dissipation member 520 and the frame 550 when connecting the antenna module 510 to the heat dissipation sheet 620 through the first heat dissipation member 520. In addition, the frame 550 and the first heat dissipation member 520 may be modularized into one set.

If heat is transferred to the frame 550 through direct contact between the first heat dissipation member 520 and the frame 550, the heat may affect the user through the frame 550 exposed to the outside of the mobile electronic device 501. Therefore, as described above with reference to FIG. 7D, the heat insulation member 530 may be interposed between the first heat dissipation member 520 and the frame 550 for preventing direct contact.

The heat dissipation structure realized for thermal connection between the heat dissipation sheet 620 and the antenna module 510 disposed at the upper portion of the mobile electronic device 501 are described above. This is, however, exemplary only and not intended to be construed as a limitation. This description may be also applied to another antenna module 510 disposed at another position inside the mobile electronic device 501 when there is any interfering component between such an antenna module 510 and the heat dissipation sheet 620.

Figure 10A:
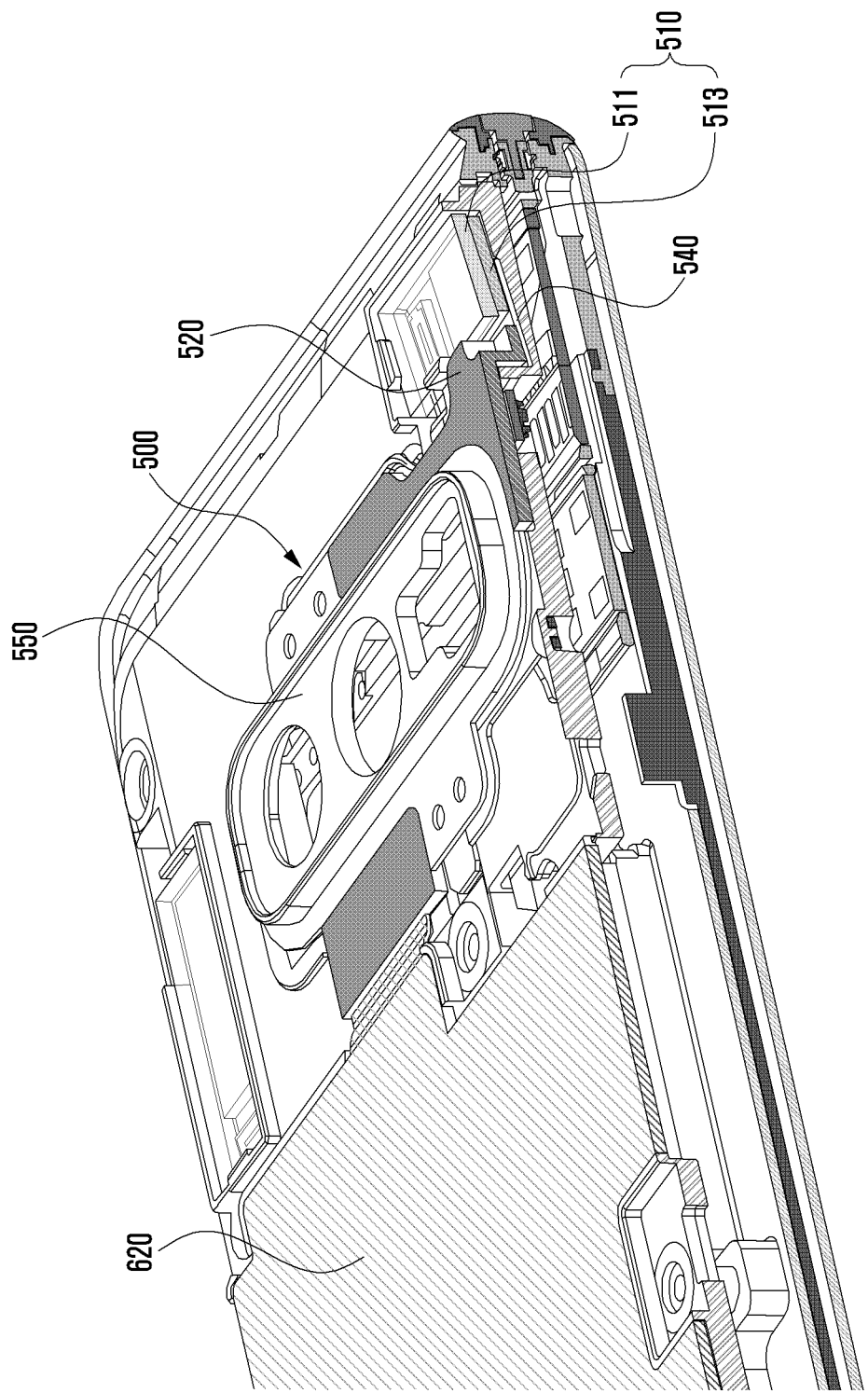
FIGS. 10A and 10B are enlarged views showing an antenna module of an electronic device including a heat dissipation structure according to an embodiment.
Figure 10B:
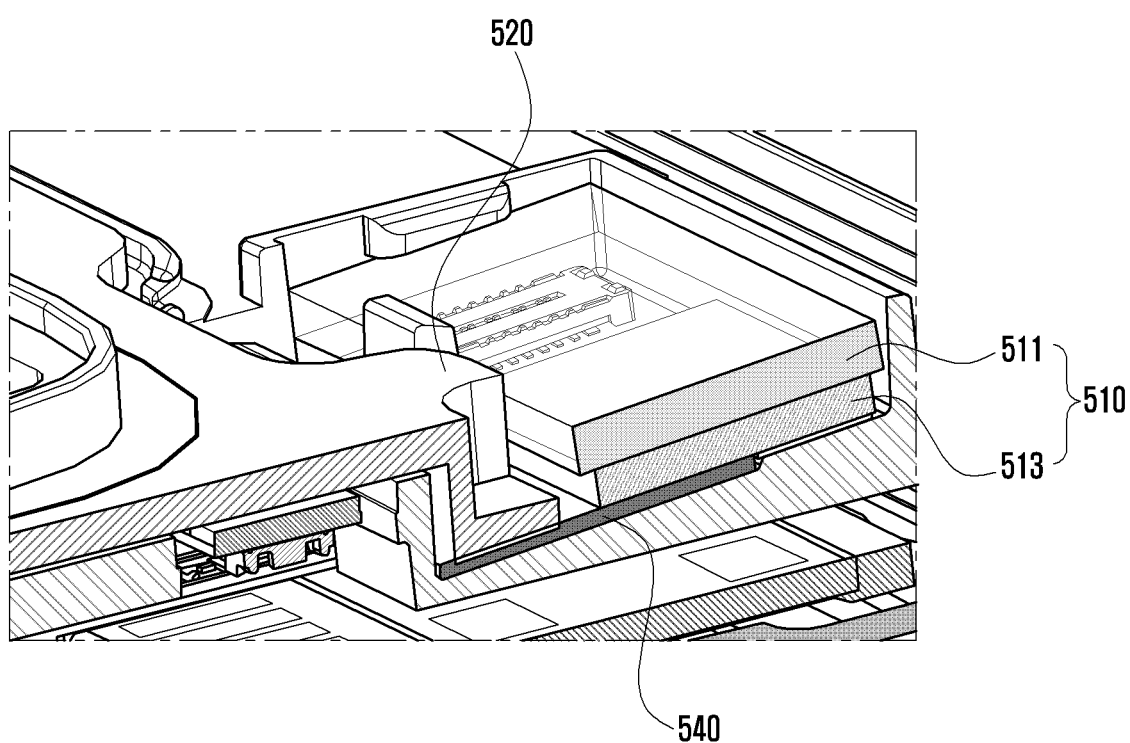

FIGS. 10A and 10B are enlarged views showing an antenna module 510 of an electronic device including a heat dissipation structure 500 according to an embodiment.

Referring to FIGS. 10A and 10B, FIG. 10A is a partially cutaway perspective view showing an area where the heat dissipation structure 500 is connected to the antenna module 510 disposed at an upper portion of the electronic device, and FIG. 10B is an enlarged view showing a location where the antenna module 510 is disposed.

As shown in FIGS. 10A and 10B, the first heat dissipation member 520 may be thermally connected to the antenna module 510 via the second heat dissipation member 540. Both the first heat dissipation member 520 and the second heat dissipation member 540 may be formed of a thermal interface material (TIM) that facilitates heat transfer. Although being formed of the TIM such as copper, aluminum, stainless steel, or graphite, heat transfer, the first heat dissipation member 520 and the second heat dissipation member 540 may have different physical properties. For example, the first heat dissipation member 520 may be rigidly formed to have a high rigidity, whereas the second heat dissipation member 540 may be flexibly formed to have a relatively high ductility. In particular, the second radiation member 540 may be formed as a tape type to thermally connect the antenna module 510 and the first heat dissipation member 520. Forming the second heat dissipation member 540 to have a high ductility, it is possible to absorb any tolerance that may occur in a process of assembling the first heat dissipation member 520, the rear case 360, the antenna module 510, and the like, or to absorb any error that may be caused by a slight difference from the design of the electronic device.

According to an embodiment, an electronic device includes a housing that includes a front plate facing a first direction, a rear plate facing a second direction opposite to the first direction, and a lateral member surrounding a space between the front and rear plates. In addition, the electronic device may include a display exposed through at least a portion of the housing, a battery disposed in the housing, and an antenna module disposed in the housing, spaced apart from the battery, and including a radio frequency (RF) circuit. When viewed above the rear plate, the electronic device may further include a first electronic component positioned between the antenna module and the battery, a first heat dissipation member disposed to be partially overlapped with the first electronic component and to extend toward the antenna module, a frame disposed to be partially overlapped with the first heat dissipation member, to surround at least a part of the first electronic component, and to form a part of an outer appearance of the electronic device, and a heat insulation member interposed between the frame and the first heat dissipation member.

The electronic device may further include, when viewed above the rear plate, a second heat dissipation member attached to and overlapped with at least a portion of the antenna module and extending toward the first electronic component to be in contact with at least a portion of the first heat dissipation member.

The first heat dissipation member may be formed of at least one of copper, aluminum, stainless steel, graphite, or thermal-conductive plastic.

The frame may be formed of a metallic material.

The heat insulation member may be formed of at least one of polycarbonate, polyamide, or polyethylene.

According to an embodiment, a heat dissipation structure may include a frame surrounding at least a portion of a component exposed to an outer surface of an electronic device and forming a part of the outer surface of the electronic device, a heat dissipation sheet thermally connected to a battery of the electronic device, a first heat dissipation member disposed to be partially overlapped with the frame, extended toward an antenna module of the electronic device, and thermally connected to the heat dissipation sheet, and a heat insulation member interposed between the frame and the first heat dissipation member.

The frame, the first heat dissipation member, and the heat insulation member may be sequentially layered and combined with each other.

The heat insulation member may be formed to match a shape of a portion where the first heat dissipation member and the frame are overlapped with each other.

The first heat dissipation member may be formed of at least one of copper, aluminum, stainless steel, graphite, or thermal-conductive plastic.

The heat dissipation structure may further include a second heat dissipation member extended from the first heat dissipation member, being in contact with at least a portion of the antenna module, and thermally connecting the first heat dissipation member and the antenna module.

The antenna module may include a circuit board, a communication component disposed on one surface of the circuit board, and an antenna pattern disposed on an opposite surface of the circuit board. The second heat dissipation member may be in contact with the communication component.

The second heat dissipation member may be formed of at least one of copper, aluminum, stainless steel, graphite, or thermal-conductive plastic.

The antenna module may be disposed at an upper portion of the electronic device so as not to overlap with a front camera module and a receiver of the electronic device.

The heat dissipation sheet may be formed of a plate having a vacuum internal space and contain a moisture in the internal space.

The component may be a rear camera module exposed to a rear surface of the electronic device, and the frame may be a decorative member surrounding at least a part of the rear camera module.

The component may be exposed to a rear surface of the electronic device, and the frame may be formed as a plate printed or engraved with a brand label.

According to an embodiment, a heat dissipation structure may include a frame surrounding at least a portion of a component exposed to an outer surface of an electronic device and forming a part of the outer surface of the electronic device, a first heat dissipation member disposed to be partially overlapped with the frame, and extended, at one end thereof, toward an antenna module of the electronic device, a second heat dissipation member thermally connecting the antenna module and the first heat dissipation member, and a heat insulation member interposed between the frame and the first heat dissipation member.

The frame, the first heat dissipation member, and the heat insulation member may be sequentially layered and combined with each other.

The heat insulation member may be formed to match a shape of a portion where the first heat dissipation member and the frame are overlapped with each other.

The first heat dissipation member may be thermally connected, at an opposite end thereof, to a heat dissipation sheet of the electronic device.

Heat dissipation of the antenna module may be performed by utilizing the heat dissipation sheet disposed in the electronic device without requiring any heat dissipation structure for the antenna module.

While the present disclosure has been particularly shown and described with reference to embodiments thereof, it will be understood by those skilled in the art that various changes in form and details may be made therein without departing from the scope of the subject matter as defined by the appended claims and their equivalents.

What is claimed is:

1. An electronic device, comprising:
   a housing;
   a display exposed through at least a portion of the housing;
   a battery including a heat dissipation sheet thermally connected to the battery;
   an antenna module disposed spaced apart from the battery;
   an electronic component positioned spaced apart from the antenna module and the battery;
   a first heat dissipation member disposed to partially overlap the electronic component and to extend toward the antenna module, and thermally connected to the heat dissipation sheet; and
   a heat insulation member interposed between the electronic component and the first heat dissipation member.

2. The electronic device of claim 1, further comprising:
   a second heat dissipation member attached to and overlapping at least a portion of the antenna module and extending toward the electronic component to contact at least a portion of the first heat dissipation member.

3. The electronic device of claim 1, wherein the first heat dissipation member is formed of at least one of copper, aluminum, stainless steel, graphite, or thermal-conductive plastic.

4. The electronic device of claim 1, wherein the heat insulation member is formed of at least one of polycarbonate, polyamide, or polyethylene.

5. An electronic device, comprising:
   a frame surrounding at least a portion of a component exposed to an outer surface of the electronic device and forming a part of the outer surface of the electronic device;

a heat dissipation sheet thermally connected to a battery of the electronic device;

a first heat dissipation member disposed to partially overlap the frame, extended toward an antenna module of the electronic device, and thermally connected to the heat dissipation sheet; and a heat insulation member interposed between the frame and the first heat dissipation member.

6. The electronic device of claim 5, wherein the frame, the first heat dissipation member, and the heat insulation member are sequentially layered and combined with each other.

7. The electronic device of claim 5, wherein the heat insulation member is formed to match a shape of a portion where the first heat dissipation member and the frame overlap.

8. The electronic device of claim 5, wherein the first heat dissipation member is formed of at least one of copper, aluminum, stainless steel, graphite, or thermal-conductive plastic.

9. The electronic device of claim 5, further comprising:
a second heat dissipation member extended from the first heat dissipation member, in contact with at least a portion of the antenna module, and thermally connecting the first heat dissipation member and the antenna module.

10. The electronic device of claim 9, wherein the antenna module includes:
a circuit board;
a communication component disposed on one surface of the circuit board; and
an antenna pattern disposed on an opposite surface of the circuit board, and
wherein the second heat dissipation member is in contact with the communication component.

11. The electronic device of claim 9, wherein the second heat dissipation member is formed of at least one of copper, aluminum, stainless steel, graphite, or thermal-conductive plastic.

12. The electronic device of claim 5, wherein the antenna module is disposed at a portion of the electronic device to not overlap a front camera module and a receiver of the electronic device.

13. The electronic device of claim 5, wherein the heat dissipation sheet is formed of a plate having a vacuum internal space and contains moisture in the vacuum internal space.

14. The electronic device of claim 5, wherein the component is a rear camera module exposed to a rear surface of the electronic device, and the frame is a decorative member surrounding at least a part of the rear camera module.

15. The electronic device of claim 5, wherein the component is exposed to a rear surface of the electronic device, and the frame is formed as a plate printed or engraved with a brand label.

16. A heat dissipation structure, comprising:
a frame surrounding at least a portion of a component exposed to an outer surface of an electronic device and forming a part of the outer surface of the electronic device;
a first heat dissipation member disposed to partially overlap the frame, and extended, at one end thereof, toward an antenna module of the electronic device;
a second heat dissipation member thermally connecting the antenna module and the first heat dissipation member; and
a heat insulation member interposed between the frame and the first heat dissipation member.

17. The heat dissipation structure of claim 16, wherein the frame, the first heat dissipation member, and the heat insulation member are sequentially layered and combined with each other.

18. The heat dissipation structure of claim 16, wherein the heat insulation member is formed to match a shape of a portion where the first heat dissipation member and the frame overlap.

19. The heat dissipation structure of claim 16, wherein the first heat dissipation member is thermally connected, at an opposite end thereof, to a heat dissipation sheet of the electronic device.

* * * * *